US006672878B2

(12) United States Patent
Dean

(10) Patent No.: US 6,672,878 B2
(45) Date of Patent: Jan. 6, 2004

(54) ACTUATABLE CONNECTOR SYSTEM

(75) Inventor: Steven J. Dean, Chippewa Falls, WI (US)

(73) Assignee: Silicon Graphics, Inc., Mountain View, CA (US)

( * ) Notice: Subject to any disclaimer, the term of this patent is extended or adjusted under 35 U.S.C. 154(b) by 3 days.

(21) Appl. No.: 10/160,437

(22) Filed: May 31, 2002

(65) Prior Publication Data

US 2003/0224630 A1 Dec. 4, 2003

(51) Int. Cl.[7] .............................................. H01R 12/00
(52) U.S. Cl. ...................................................... 439/67
(58) Field of Search ............................ 439/65, 67, 630, 439/635, 77; 361/752

(56) References Cited

U.S. PATENT DOCUMENTS

| | | | | |
|---|---|---|---|---|
| 4,686,607 A | * | 8/1987 | Johnson ....................... 361/788 |
| 5,190,462 A | * | 3/1993 | Lauchner et al. ............. 439/65 |
| 5,648,891 A | * | 7/1997 | Gierut ........................ 361/788 |
| 5,871,362 A | * | 2/1999 | Campbell et al. ............. 439/67 |
| 5,895,278 A | * | 4/1999 | Humphrey ................... 439/101 |
| 5,975,934 A | * | 11/1999 | Ichimura ..................... 439/260 |
| 6,122,161 A | * | 9/2000 | Gierut ........................ 361/683 |

* cited by examiner

Primary Examiner—Tulsidas Patel
(74) Attorney, Agent, or Firm—Schwegman, Lundberg, Woessner & Kluth, P.A.

(57) ABSTRACT

A system assembly for a computer includes a motherboard situated on a printed circuit board, and a daughterboard situated on a printed circuit board. In the system assembly the daughterboard is positioned parallel to the motherboard. The daughterboard is connected to the motherboard using a connector system. The connector system has a first portion affixed to either the motherboard or the daughterboard which includes a first capture feature and has an opening therein. A second portion has a second capture feature which mates with the first capture feature. A third portion is attached to the second portion of the connector system. A cam moves the third portion with respect to the second portion. A flexible circuit electrically connects the first end and the second end of the connector system. The flexible circuit is of a length to form a curve when the first end and the second end are connected between the first electrical component and the second electrical component.

26 Claims, 10 Drawing Sheets

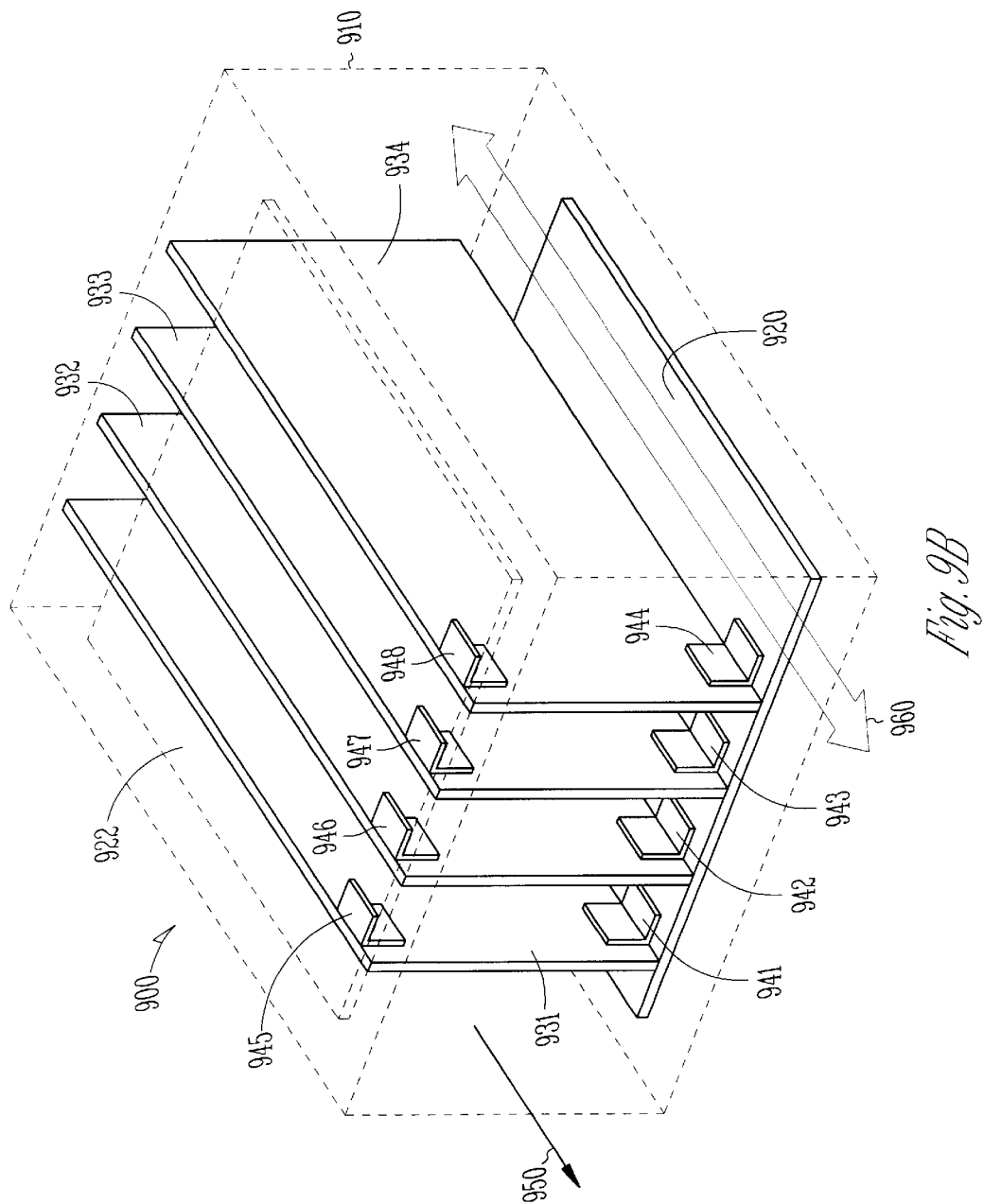

ACTUATABLE CONNECTOR SYSTEM

FIELD OF THE INVENTION

The present invention relates to an electrical connector and more specifically to an electrical connector used to connect printed circuit boards.

BACKGROUND OF THE INVENTION

High speed electronic digital computers of the type produced by Silicon Graphics, Inc., the assignee hereof, typically require multitudes of electrical connections between various printed circuit cards within a system. Presently, one printed circuit board or mother board is provided with a plurality of connectors along one surface. Other printed circuit boards, called daughter boards, include edge connectors and are attached or plugged into the plurality of connectors on the mother board. Typically, only one surface of the mother board is provided with connectors and one edge of a daughter board is provided with an edge connector. This prevents problems with stack up tolerance. Currently, a daughter board is not provided with edge connectors on two edges because stack up tolerances make it nearly impossible to connect a daughter board to a mother board and another board. Typically, the motherboard is in a fixed position when one or more daughter boards are plugged into the slots of the motherboard. Adding another motherboard to the daughterboards is nearly impossible to accomplish because of differences due to tolerances between two connectors on each edge of the daughterboard and because of differences due to tolerances between the connectors on the second board. In summary, one motherboard is connected to a number of daughterboards. The daughterboards are connected only to one motherboard. As a result, there is a lack of flexibility in making connections between motherboards and daughterboards. The arrangements for connecting daughterboards to motherboards are limited. There are no interconnection between daughterboards. Furthermore, each daughterboard is connected to only one motherboard. In other words, the number of interconnections between and first board and a second board are limited to one interconnection.

The lack of flexibility in connecting motherboards and daughterboards also causes other sets of problems. Some computer systems are rack mounted. Generally, the various components of the system are placed in vertical racks. The lack of flexibility in connecting motherboards and daughterboards causes problems in rack mounted systems. The problems include accessibility to the motherboard and the daughterboard, and space which must be wasted in order to cool a motherboard and daughterboard "brick". One common way of mounting motherboards and daughterboards in rack-mounted systems is to have a motherboard which extends horizontally across the back of a rack-mount unit. This motherboard is referred to as a backplane. The backplane has a number of connecters mounted on a surface of the backplane. Daughterboards are connected to the connectors to the connectors on the backplane. The daughterboards are passed through the front of the rack mount unit and then edge connectors are engaged with the slots on the backplane. This system of daughterboards connecting into motherboards allows easy access to the daughterboards. The motherboard or backplane can also be accessed after removing some or all of the daughterboards. One of the problems is that daughterboards only have one connection to another board. In other words, the daughterboards do not interconnect to one another unless through the motherboard.

Motherboards and daughterboards include electrical components that must be cooled. The components on these boards can be air cooled. The problem is that the arrangement of a motherboard serving as a backplane with daughterboards plugging into connectors on the motherboard is somewhat difficult to cool. The motherboard blocks airflow through the brick. The airflow necessary to cool the "brick" must flow around the top and bottom of the motherboard and then past the daughterboards connected into the motherboard. Of course, the airflow could be reversed and also cool the "brick". The problem is that additional space must be provided to accommodate the airflow. Rack mount systems have different sized racks for different items. The size of the rack is generally fixed in terms of width and depth so the only dimension that varies with individual rack mount portions is the height of the rack mount portion. The height is generally spoken of in terms of Us. One U equals 1.75 inches. The height of the motherboard serving as a backplane is 6 U the height of the rack mount unit is 10 U. In order to cool the arrangement of daughterboards plugged into a backplane motherboard, 4 U must be allotted to provide for sufficient air flow to cool the "brick". Other arrangements could be designed if the design was not limited to a backplane with a single surface carrying a set of connectors into which the daughterboards were connected. Other arrangements would not require space including 4 U needed for sufficient airflow.

A motherboard with multiple slots into which daughterboards connect requires that a relatively substantial force be applied to the daughterboard in order to force the daughterboard into the connector on the motherboard. There is also a lack of any alignment features which can be used to guide the daughterboard into the slot of the motherboard. People servicing computers have been known to apply a force to the daughterboard while it is not properly aligned. This would be less likely to occur if the connector included alignment guides. A problem with current connectors is that there is a lack of alignment, and a lack of a balance of forces. These add up to a less reliable system.

Therefore, there is a need for a connector that is flexible and which can accommodate differences in tolerance between various boards. There is also a need for a connector which can carry multiple signals. Furthermore, there is a need for a connector that can carry signals between motherboards and daughterboards, and also between daughterboards without having to travel through a motherboard. In other words, there is a need for a connector that allows for connection between any two boards. For example, a connector that allows a daughterboard to connect to another daughterboard in a "brick". There is a further need for a device that is relatively inexpensive and which is reliable.

SUMMARY OF THE INVENTION

A connector system for places a first electrical component in electrical communication with a second electrical component. The connector system includes a first end attached to the first electrical component. The first end has a first portion affixed to one of the first electrical component and the second electrical component. The affixed portion includes a first capture feature. A second portion has a second capture feature which mates with the first capture feature. A third portion is attached to the second portion. One of the first portion and the second portion has an opening therein. The opening has a set of guide ways. The second and third portion are attached by a cam. The cam allows the third portion to move with respect to the second portion. The third portion includes a portion which engages the opening having a set of guide ways. A second end is attached to the second electrical component. A flexible circuit electrically connects the first end and the second end of the connector system. The set of guide ways includes at least two beveled edges of the opening. In some embodiments, the connector system also includes a first set of electrical contacts positioned within the opening, and a second set of electrical contacts positioned on the portion of the connector which engages the opening. Electrical contact is achieved between the contacts when the third portion of the connector engages the first portion of the connector. In some embodiments, the cam is a wedge, or includes a lobe and is rotatable. The flexible circuit is of a length to form a curve when the first end and the second end are connected between the first electrical component and the second electrical component. The first capture feature of the first affixed portion slides with respect to the second capture feature of the second portion. In some embodiments, at least one of the first capture feature and second capture feature is beveled. In other embodiments, the first capture feature and second capture feature include a detent and detent engaging portion. The detent engaging portion engages the detent when the first portion is substantially correctly positioned in a first plane with respect to the third portion. In some embodiments, one of the first capture feature and the second capture feature of the second portion includes a lip and the other capture feature includes a dovetail which engages the lip.

The connector system can also be used as part of a system assembly for a computer. In the system assembly, the connector system is used to connect a motherboard situated on a printed circuit board, and a daughterboard situated on a printed circuit board. In the system assembly the daughterboard is positioned parallel to the motherboard. The connector system allows for multiple connections to be made between a motherboard and a daughterboard in the system assembly. The connector system also allows for multiple connections to be made between a first daughterboard and a second daughterboard in the system assembly.

Also disclosed is a module for a rack mount system including a frame, an air handling device for moving air along a substantially straight air flow path through the frame from a first end of the frame to a second end of the frame, and a plurality of printed circuit boards. The printed circuit boards are removably mounted within the frame. The printed circuit boards have a first edge near the first end of the frame and a second edge near the second end of the frame. The first edge and the second edge of the circuit boards are within the substantially straight air flow path. The plurality of printed circuit boards are substantially parallel to one another. In the rack mount system at least one of the plurality of printed circuit boards includes a system bus thereon. In some embodiments, at least two of the plurality of printed circuit boards include a first electrical contact near one end of the printed circuit board and a second electrical contact near the other end of the printed circuit board. One electrical connector connects between the two electrical contacts near one end of each of the two boards. Another electrical connector connects between two electrical contacts near the other end of each of the two printed circuit boards. In some embodiments, there are at least two electrical connections between at least two of the printed circuit boards.

The actuatable connector has many advantages. Several of the advantages arise from the flexibility the connector affords when configuring motherboards and daughterboards in a computer system. The actuatable connector allows daughterboards to be attached to motherboards while the daughterboard is substantially parallel to the motherboard. This is advantageous since all the printed circuit boards in a system where a number of daughterboards must be connected to a motherboard can be configured to be substantially parallel to one another. This allows for a simple air flow configuration for a rack application. The cooling air would flow past all the boards which are substantially parallel with one another. As a result, there is no need to devote rack space to plenums or "dead space" to allow an air flow path past the printed circuit cards (the motherboard and the daughterboards). This allows for maximum utilization of rack space. In addition, the size of the printed circuit boards is minimized for each application. Since the printed circuit boards can be parallel to one another, the edges of both the daughterboards and the motherboards can be positioned at the two ends of a "brick" or rack mount system. This allows for connection along both edges of a board which is comparable to having two side planes. Advantageously, the motherboards and daughterboards can be connected together without deflection on the board. The acuatable connector has a flex cable which can bend. The flex cable allows for a very large mechanical tolerance so that boards could be connected together in a number of configurations without producing physical strains on other boards or the connectors themselves. In other words, the actuatable connector constrains the forces for mating the connector to the connector system, thereby eliminating deflection problems due to other boards or other elements. In addition, since the boards are placed in parallel with one another, each board can be easily translated in and out of a volume. In the past, more elaborate translation systems were used since one card would have to plug into another card positioned as a backplane.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

FIG. 9B illustrates a perspective view of another embodiment of a system that includes double side plane motherboards.

The description set out herein illustrates the various embodiments of the invention and such description is not intended to be construed as limiting in any manner.

DESCRIPTION OF THE PREFERRED EMBODIMENT

In the following detailed description of the preferred embodiment, reference is made to the accompanying drawings which form a part hereof, and in which are shown by way of illustration specific embodiments in which the invention may be practiced. It is to be understood that other embodiments may be utilized and structural changes may be made without departing from the scope of the present invention.

Figure 1A:
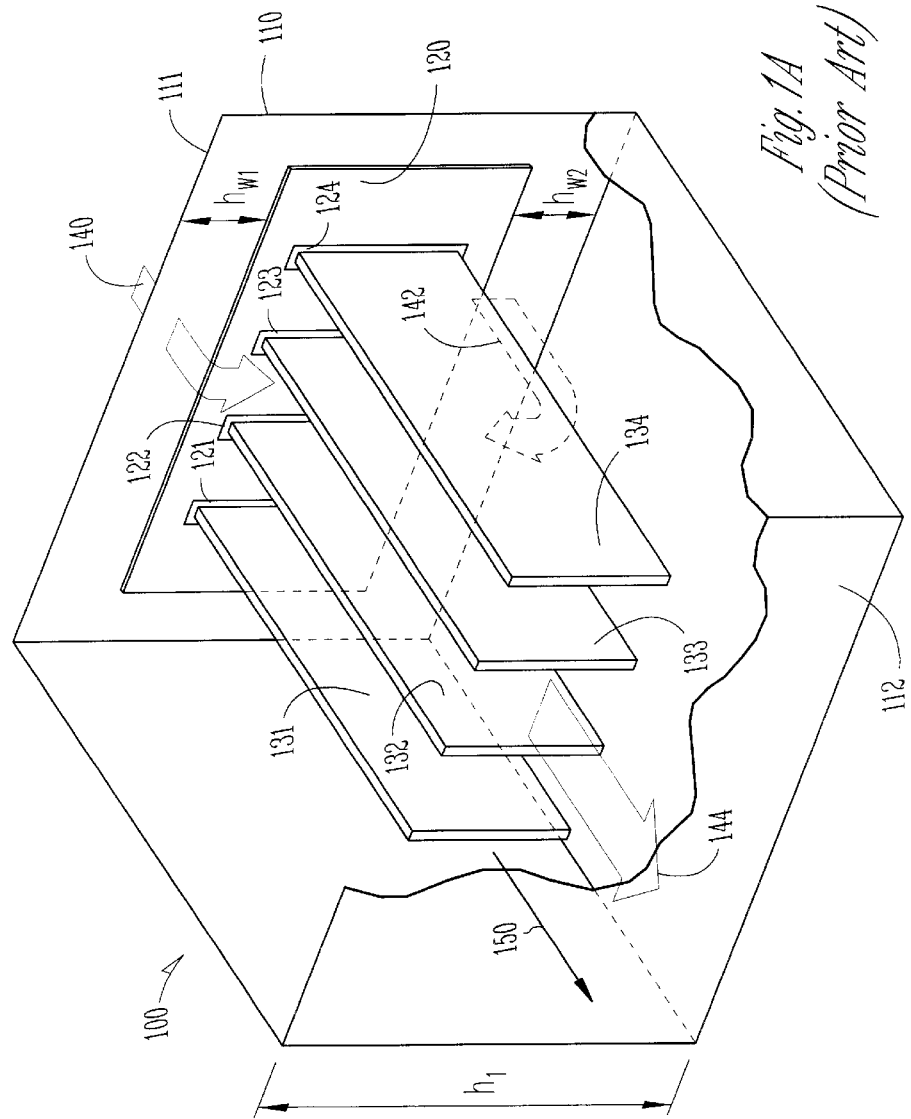
FIG. 1A illustrates a perspective view of a prior art system assembly in a rack.

FIG. 1A illustrates a perspective view of a prior art system assembly 100 in a rack unit 110. The rack unit 110 has a fixed width and depth as determined by the manufacturer of the rack. The height dimension $h_1$ is the dimension which varies in a rack unit 110. FIG. 1A shows the prior art arrangement of the system assembly 100. The system assembly 100 includes a motherboard 120 having a plurality of connectors 121, 122, 123, 124. The system assembly 100 also includes a plurality of daughterboards 131, 132, 133, 134 which plug into the slots associated with the connectors 121, 122, 123, 124. In the arrangement shown, the motherboard 120 is referred to as a back panel. The connectors 121, 122, 123, 124 are edge connectors which grip the edge of the respective printed circuit boards 131, 132, 133, 134 after they are pressed or forced into the slot associated with the connectors 121, 122, 123, 124. The edge of each of the printed circuit boards or daughterboards 131, 132, 133, 134 are provided with electrical contacts which engage corresponding electrical contacts in the slots of the connectors 121, 122, 123, 124 attached to the motherboard 120 serving as the backplane. In order to make adequate electrical contact, each of the daughter boards is forced into the connectors 121, 122, 123, 124 of the motherboard 120. The motherboard 120 and backplane undergoes large stresses and is more prone to failed connections within the motherboard 120 and on the components which populate the motherboard 120. Yet another problem is that this arrangement blocks off the airflow across the rack unit 110. In other words, air can not flow straight through the rack 110. Arrows 140 and 142 show the air flow on a first end 111 of the rack 110. Arrow 150 shows the direction for extraction and addition of daughter boards 131, 132, 133, 134 with respect to the motherboard. As shown by arrows 140, 142, the air must flow over the top and bottom of the motherboard 120 and then down between the daughterboards attached to the motherboards. The air flows depicted by arrows 140, 142 combine and form the output airflow depicted by arrow 144. The rack height $h_1$ must be greater than the height of the printed circuit board or motherboard 120 which, while acting as a backplane also blocks the airflow path through the rack 110. In rack mount terms, the unit of rack mount height is "U" which is equal to 1.75 inches. As shown in FIG. 1 by way of example, the height $h_1$ is 10 U. The height of the motherboard is 6 U. In other words, $h_{w1}$ is 2 U and $h_{w2}$ is also 2 U. Put another way, the rack 110 must be provided with 4 U extra height in order to allow adequate air flow around the motherboard 120. This is a very inefficient design from a cooling standpoint since 4 U or 40 percent of the height $h_1$ of a 10 U rack 110 is devoted to space needed to accommodate the needed airflow, depicted by arrows 140, 142 for cooling the system assembly 100. The system assembly 100 is also known as a "brick". The motherboard 120 of the system assembly 100 includes a bus for data and commands. The bus is the path to various critical items associated with the computer.

Another shortcoming associated with the prior art arrangement is that there are typically many daughterboards 131, 132, 133, 134 which are plugged or forced into the slots 121, 122, 123, 124 on the motherboard 120. Each daughterboard 131, 132, 133, 134 is slightly different in length merely due to differences in mechanical tolerance. The spacing between the connectors 121, 122, 123, 124 is also different due to differences in tolerance. These tolerance differences are insignificant as long as all the daughterboards 131, 132, 133, 134 are plugged into one motherboard 120. However, the tolerances stack up or essentially make it impossible if each end of the daughterboards 131, 132, 133, 134 were to be connected. Such as structure would also be difficult to cool since there would effectively be two air dams in the air flow path. Of course, there are other problems also associated with the prior art arrangement shown in FIG. 1A.

Figure 1B:
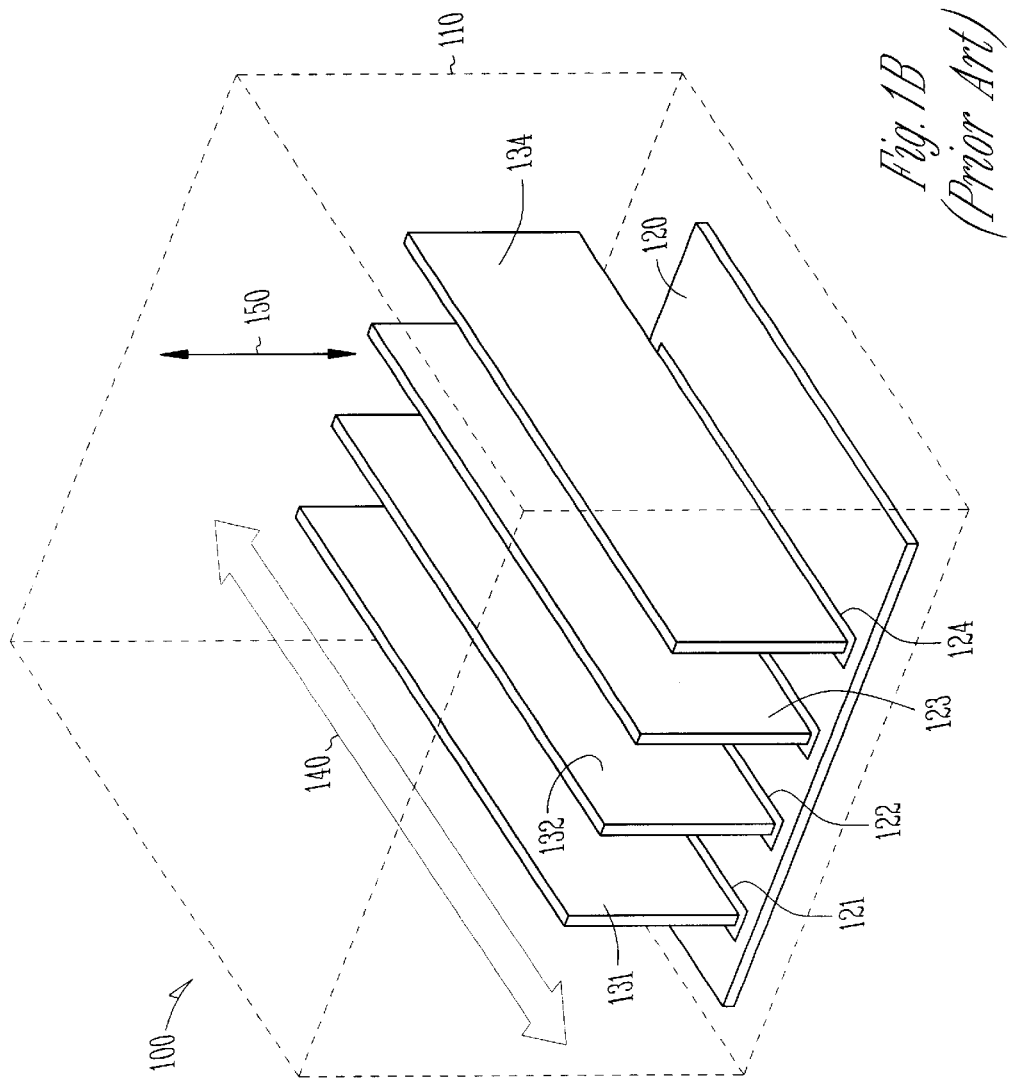
FIG. 1B illustrates a perspective view of a prior art system assembly associated with a case.

FIG. 1B shows another prior art arrangement of a system assembly 100 associated with a personal computer or a case like a personal computer. The case is generally sized to accommodate different form factors of motherboards 120 which fit within the case. There are cases that are used for storing server type. computers as well as home computers or workstations. The case is depicted by the dotted box surrounding the motherboard 120 and a set of daughter boards 131, 132, 133, 134. The motherboard 120 includes a number of electrical contact slots 121, 122, 123, 124 which receive edge connectors or an edge of the daughter boards 131, 132, 133, 134. As shown, the motherboard 120 is generally referred to as a side panel. The connectors 121, 122, 123, 124 are edge connectors which grip the edge of the respective daughter boards or printed circuit boards 131, 132, 133, 134 after being pressed or forced into the slot associated with the connectors 121, 122, 123, 124. The edge of the printed circuit boards or daughter boards 131, 132, 133, 134 are provided with electrical contacts which engage corresponding electrical contacts in the slots of the connectors 121, 122, 123, 124 associated with the motherboard 120. It should be noted that the daughter boards 131, 132, 133, 134 shown in FIG. 1B are all of uniform size. This is not necessarily the case as the daughter boards 131, 132, 133, 134 may be smaller or larger. The portion of the daughter boards or circuit boards 131, 132, 133, 134 which engage the slots 121, 122, 123, 124 is uniform. Generally, there are at least two types of slots on a PC-based motherboard. The slots will have different sizes. For example, some motherboards 120 include slots for a PCI bus and these slots (not shown) are generally smaller than the slots associated with the connectors 121, 122, 123, 124. One problem associated with the system assembly 100 shown in FIG. 1B is that the motherboard 120 acting as a side plane, undergoes large stresses and may be prone to failed connections within the motherboard 120 or in the components which populate the motherboard 120. Yet another problem is that the top of the box or a portion of the case, shown in dotted lines, must be removed in order to extract or add daughter boards 131, 132, 133, 134 to the motherboard 120. Arrow 150 shows the direction in which the daughter boards 131, 132, 133, 134 must be moved in order to extract or add daughter boards 131, 132, 133, 134 to the motherboard 120. Arrow 140 shows the airflow direction through the case for the system assembly 100. Generally in a home-based or server-based unit, there are no restrictions with respect to height of the case or with respect to dimensions of the case so that adequate airflow can be accommodated. It should be noted, however, that in some instances, cases such as the one shown in FIG. 1B may be converted to rack-mount systems. Yet another problem is that the tolerance difference between the connectors 121, 122, 123, 124 and the daughter boards 131, 132, 133, 134 essentially make it impossible for more than one connection between the daughter boards and the motherboard.

Figure 2:
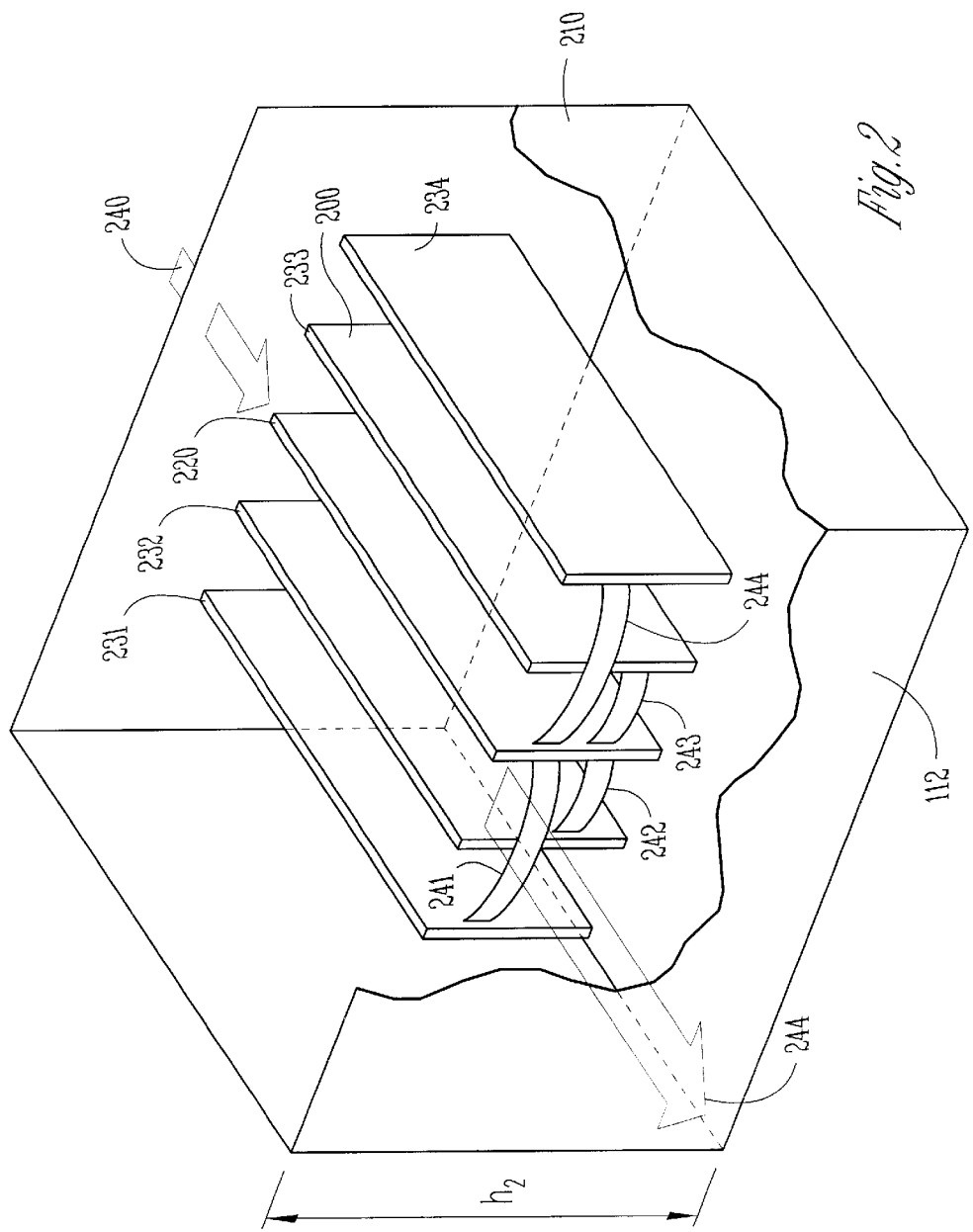
FIG. 2 illustrates a perspective view of the inventive system assembly in a rack.
Figure 3:
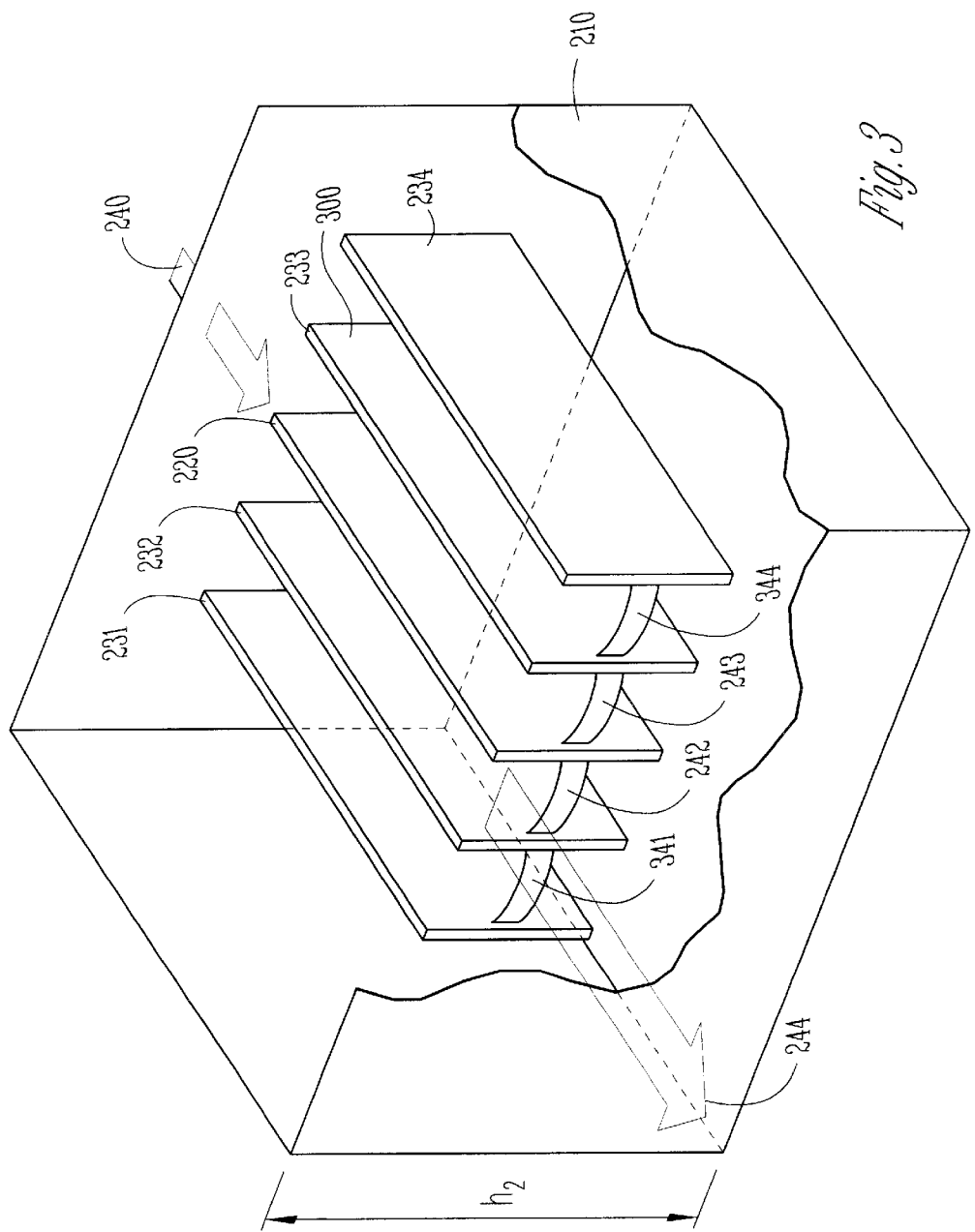
FIG. 3 illustrates a perspective view of another embodiment of the system assembly of this invention in a rack.
Figure 4:
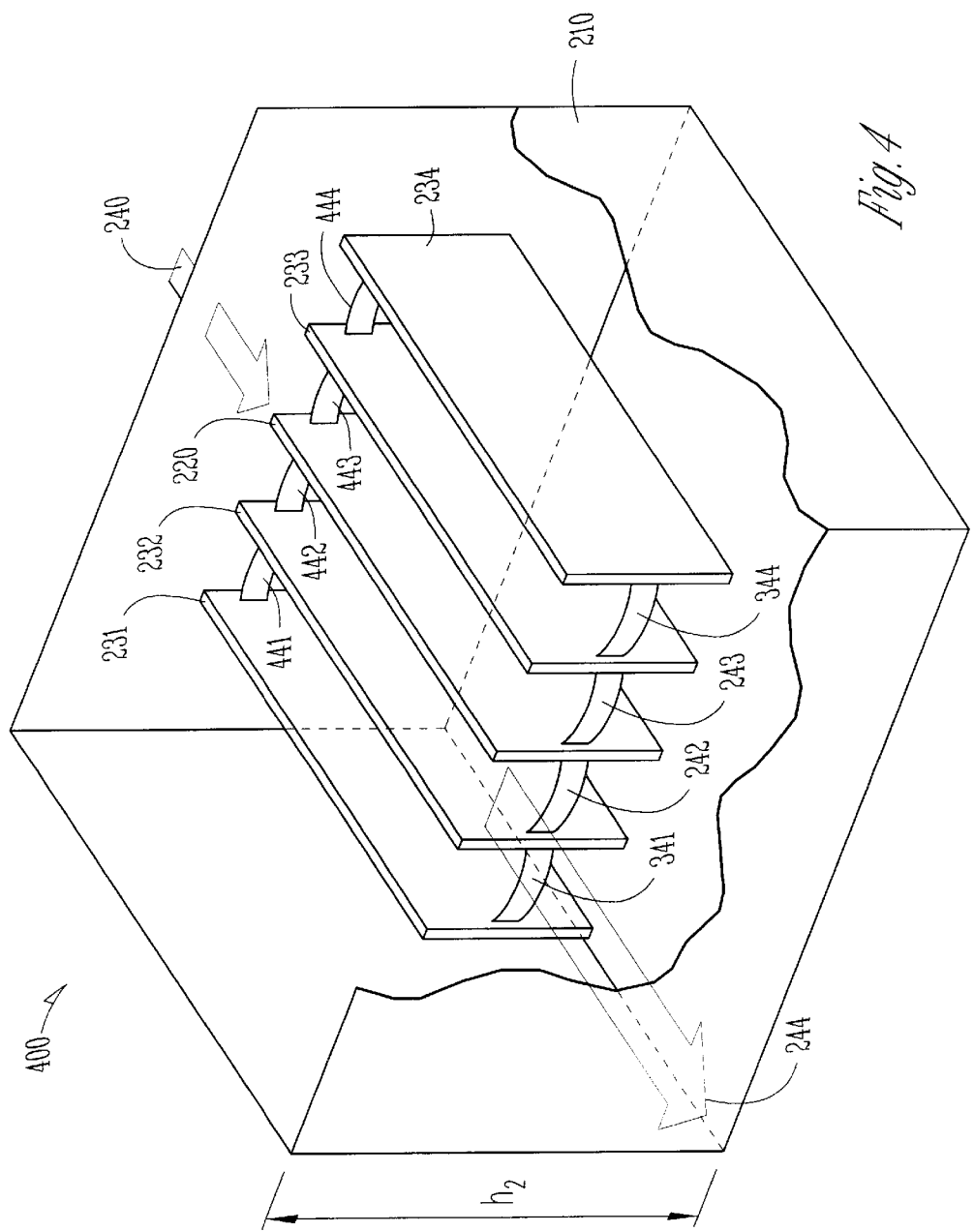
FIG. 4 illustrates still another perspective view of another embodiment of the system assembly of this invention in a rack.

FIG. 2 illustrates a perspective view of the inventive system assembly 200 in a rack 210. The rack 210 has a height $h_2$. The height $h_2$ of the rack 210 is less than the height $h_1$ of the rack 110 shown in FIG. 1. The system assembly 200 includes a motherboard 220 and several daughterboards 231, 232, 233, 234. As shown in FIG. 2, there is no backplane, or the motherboard 220 is not situated so that edge connectors associated with the daughterboards 231, 232, 233, 234 must plug into the motherboard 220. Rather than having receptacles which receive edge connectors in the motherboard, there are a series of flexible connections made between the boards 231, 232, 233, 234 and the motherboard 220. As shown in FIG. 2, there is a flexible connector 241 associated with the first daughterboard 231, a flexible connector 242 associated with the daughterboard 232, a flexible connector 243 associated with the daughterboard 233, and a flexible connector 244 associated with the daughterboard 234. As shown in FIG. 2, flexible connector 242 interconnects the daughterboard 232 with the motherboard 220, and flexible connector 243 interconnects the daughterboard 233 with the motherboard 220, flexible connector 243 interconnects the daughterboard 231 with the motherboard 220, and flexible connector 244 interconnects the daughterboard 234 with the motherboard 220. It should be noted that although each of the connectors 241, 242, 243, 244 interconnects a daughterboard with a motherboard, that other connection arrangements could be made (as shown in FIGS. 3 and 4). The flexible connectors 241, 242, 243, 244 each have, or include, a flex cable carrying a number of conductors, which are used to carry signals to and from each one of the particular boards to which the flexible connectors 241, 242, 243, 244 are connected. As shown in FIG. 2, the chief difference between connectors 242, 243 and connectors 241, 244 is the length of the flexible cable between the two ends of the connector where they are connected at the respective boards. It should be noted that the flexible cable portion carries all the signals that were previously associated with input and output from the board in the construction shown in FIG. 1. The chief advantage of the inventive system assembly 200 shown in FIG. 2 is that the motherboard 220 and the daughterboards 231, 232, 233, 234 can be arranged so that the major surfaces of each of the boards 231, 232, 233, 234, 220 are parallel to one another. Another way of putting this is that the edges of all the boards 231, 232, 233, 234, 220 face only four sides of the cube which forms the rack 210. This provides for an essentially straight-through airflow path for cooling the system assembly 200 which is inside the rack 210. The straight airflow is depicted by arrows 240 and 244. There is no necessity to split the airflow to allow the air to get around a blocking board so that the airflow input, as depicted by reference numeral 240, is the same as the arrow representing the airflow output, depicted by reference numeral 244. The result of this is that there is no plenum or extra space necessary either at the top or the bottom of the rack 210 in order to allow for airflow to be split and pass over a backplane, which effectively serves as a dam to airflow. As a result, the height $h_2$ is less than the height $h_1$ of the rack 110 shown in FIG. 1A. In other words, the space $h_{w1}$ and the space $h_{w2}$ are not required in the rack 210 shown in FIG. 2. Hence, $h_2$ is less than $h_1$. This has an advantage in that smaller racks or less sizeable racks can be used to form the system assembly. In addition, all of the boards, including the motherboard 220 and the daughterboards 231, 232, 233, 234 can be placed on transport mechanisms to allow these boards to be removed from either the front or back of the rack. The transport mechanisms are simplified since there is no need to force one of the edges of the daughterboards into a socket as in the previous arrangement shown in FIG. 1A. Thus, the amount of vertical space can be lessened. For example, if the system assembly boards 220, 231, 232, 233, 234 are 6 U in height, then $h_2$ could be approximately 7 U in height, since there is no extra space required at the top and bottom of the boards to allow for the cooling air to pass through the rack 210. The added amount is needed for clearance at the top and bottom of the rack, as well as a transport mechanism.

FIG. 3 illustrates a perspective view of another embodiment of the system assembly 300 of this invention in a rack 210. This particular embodiment differs from the embodiment shown in FIG. 2 in that the daughterboards 231, 232, 233, 234 and the motherboard 220 are connected in a slightly different way. In this particular embodiment, a flexible connector 341 is used to connect daughterboard 231 to daughterboard 232, and flexible connector 344 is used to connect daughterboard 233 to daughterboard 234. It should be noted that there can be any system or arrangement of connections between the various boards 220, 231, 232, 233, 234. In this particular arrangement, daughterboards 231 and 234 are not directly connected to the motherboard 220, but are rather connected to neighboring daughterboards 232, 233, respectively. As noted, other connectors could be used to connect daughterboards 231, 234 to the motherboard 220. In such an embodiment, the daughterboards 234 and 231 would have multiple connections between an adjacent daughterboard and the motherboard. This is within the scope of this invention. The flexible connectors 341, 242, 243, 344 allow for this type of connection. Furthermore, the flexible connectors allow for multiple connections between adjacent boards. The beauty of using flexible connectors, such as 341, 242, 243, 344 is that the flexible cables used on these flexible connectors provide for an accommodation for any type of stack-up tolerance that may occur. As shown in FIG. 3, the boards 231, 232, 220, 233, 234 are parallel with one another, and have their edges facing four faces of the rack 210. As a result, a main airflow 240 depicted by arrow 240 can be used or directed toward one end of the rack and moved across the parallel or substantially parallel faces of the various boards and output the other side of the rack as depicted by reference numeral 244. No wasted space is needed at the top or bottom of the rack to provide for airflow around a feature which would block the airflow, and thus $h_2$ is still less than $h_1$ (see FIG. 1). It should be noted that having the boards 231, 232, 233, 234 and 220 in parallel relation with one another also provides for efficient cooling which may allow more boards to be placed within the rack 210. In other words, the spacing between the boards could be lessened, since there is a straight airflow through the rack 210, as depicted by arrows 240 and 244.

FIG. 4 illustrates still another perspective view of yet another embodiment of the system assembly 400 of this invention. In this particular embodiment, daughterboards 231, 232, 233, 234 and motherboard 220 are situated within a rack 210. Each of the boards 231, 232, 233, 234, 220 is parallel to an adjacent board or substantially parallel to one another. Another way of putting this is that the edges of each of the boards 231, 232, 233, 234, 220 face four faces of the rack 210. Flexible connectors 341, 242, 243, 344 interconnect the various boards on one end, while a flexible connector 441 interconnects daughterboard 231 and daughterboard 232, and flexible connector 442 interconnects daughterboard 232 and motherboard 220, and flexible connector 443 interconnects daughterboard 233 with the motherboard 220, and flexible connector 444 interconnects daughterboard 234 with daughterboard 233. The flexible connectors 441, 442, 443, 444 all are occurring on the opposite ends of the boards 231, 232, 233, 234, 220 of the flexible connectors 341, 242, 243, 344. In other words, the flexible connectors 341, 242, 243, 344, 441, 442, 443, 444 accommodate or allow the circuit boards 231, 232, 233, 234, 220 to be connected at both ends of the circuit board. Once again, a straight through airflow path is achieved, as depicted by arrows 240, 244. This allow for highly efficient cooling of the boards 231, 232, 233, 234, 220. The flexible connectors 341, 242, 243, 344, 441, 442, 443, 444 allow for connection at both ends of each of the boards. The flexible connectors have enough of a tolerance accommodation to allow this to happen. It should be noted that the flexible connectors need not necessarily be used to attach both ends of a board, but the connections can be used intermediate the length of the boards, or at any desired distance or any desired spot on the board. It should be noted that in order to further enhance the cooling, the flexible connectors could be folded so as to present a lesser restriction to the airflow path depicted by arrows 240, 244. In addition, it should be noted that there can be any number of interconnections between the various boards, and that the flexible connectors need not be limited to connections between an adjacent board in the system assembly 400.

Figure 9A:
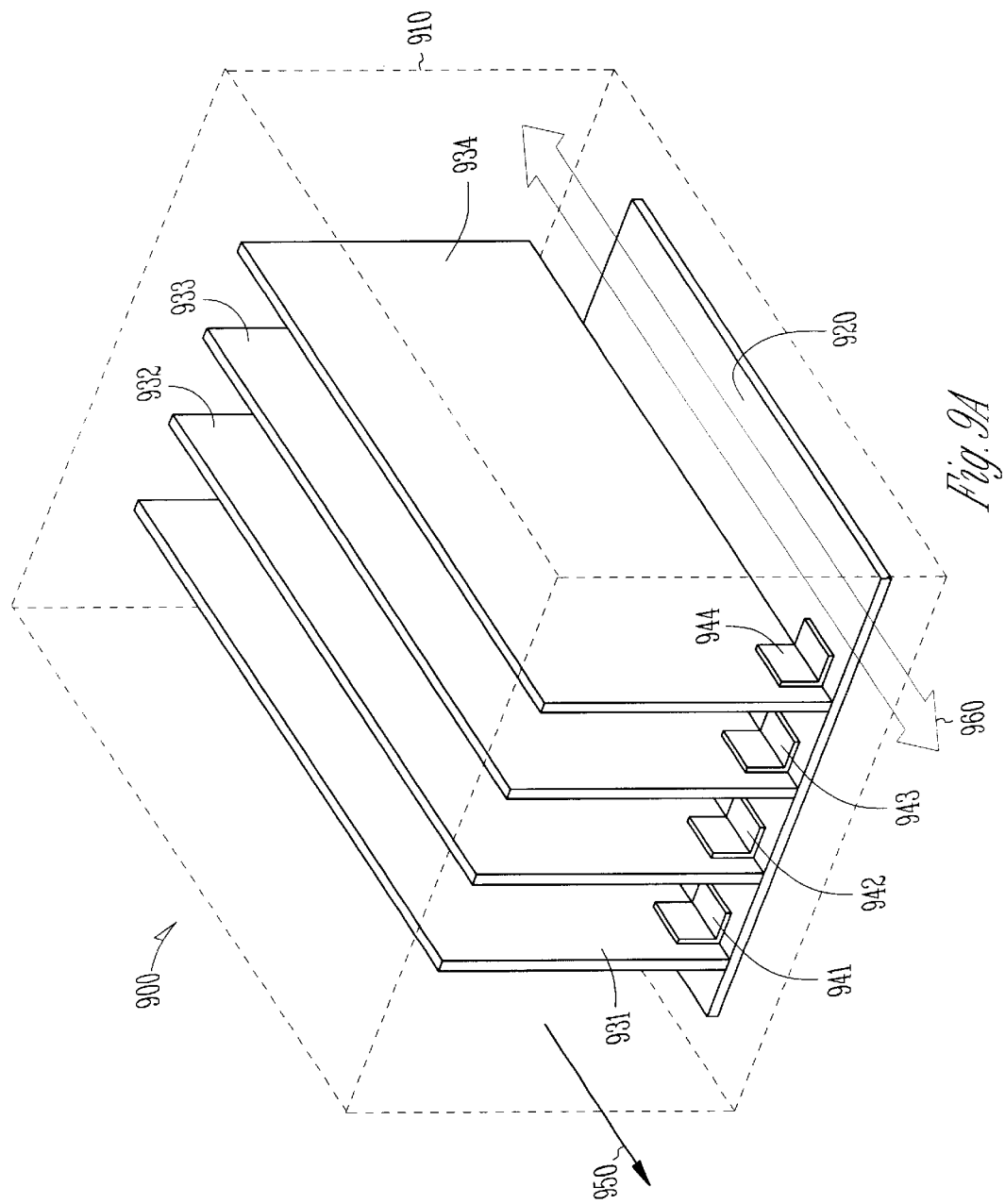
FIG. 9A illustrates a perspective view of another embodiment of a system that includes a single side plane motherboard.

FIG. 9A illustrates a perspective view of another embodiment of a system 900 that includes a single side-plane motherboard 920. Such an arrangement could be used either in a rack-mount system or in a computer case associated with a home-based personal computer, a server, or workstation or any other type of computer. The system assembly 900 includes the motherboard 920 and several daughter boards 931, 932, 933, 934. There are no edge type connectors but rather the system includes flexible connectors 941, 942, 943, and 944. The flexible connectors make the connections between the side-plane type motherboard 920 and the daughter boards 931, 932, 933, and 934. The flexible connectors 941, 942, 943, 944 each have, or include, a flex cable carrying a number of conductors, which are used to carry signals from each of the particular printed circuit boards or daughter boards 931, 932, 933, 934 to the motherboard 920. It should be noted that although only one flexible connector 941, 942, 943, 944 is associated with the connection between each of the daughter boards 931, 932, 933, 934 and the motherboard, there can be more than one flexible connector for making the connections between the single side-plane motherboard 920 and the respective daughter boards. In other words, the flexible connectors 941, 942, 943, 944 accommodate tolerance differences between the daughter boards and the motherboard. In addition, the use of the flexible connectors also accommodates these tolerance differences so that more than one connection may be made between a daughter board 931, 932, 933, 934 and the side-plane type motherboard 920. One of the advantages of the inventive system assembly 900 is that the motherboard 920 and the daughter boards 931, 932, 933, 934 can be arranged so that all the major surfaces of the various boards may be air cooled by an airflow that passes straight through the case. An arrow depicting the air flow 960 is shown in FIG. 9A. This provides for an essentially straight-through airflow path for cooling the system assembly 900 which is inside a case or rack 910. The case or rack 910 is depicted by the dotted line or hidden line assembly around the motherboard and daughter boards. Essentially, the motherboard 920 is perpendicular to the set of parallel motherboards 931, 932, 933, 934 and this allows for essentially straight-through airflow to cool all the boards within the system assembly. Yet another advantage is that the direction of extraction, carrying a reference numeral 950, allows for using the system assembly 900 in a rack mount so that the daughter boards 931, 932, 933, 934 can be easily accessed and removed or added from the motherboard 920. In addition, all of the boards including the motherboard 920 and daughter boards 931, 932, 933, 934 can be placed on a transport mechanism to allow the boards to be removed from either the front or back of the rack. Transport mechanisms are simplified since there is no need to force one of the edges of the daughter boards into a socket such as previously shown in FIG. 1A. Still a further advantage is that the removal or addition of daughter boards to the motherboard is done without producing a force between the two and, therefore, the components populating either the motherboard 920 or the daughter boards 931, 932, 933, 934 are not subjected to forces which may result in failures of these components or the connections of these components to the various boards.

FIG. 9B illustrates a perspective view of another embodiment of a system 901 that includes double side-plane motherboards. The system 901 is essentially the same as shown and described in FIG. 9A. Therefore, for the sake of clarity and brevity, the major differences between FIGS. 9A and 9B will be described, rather than repeating the common portions of the description between FIGS. 9A and 9B. One of the main differences between system 901 shown in FIG. 9B and system 900 shown in FIG. 9A is that an additional side-plane board 922 has been added. The additional side-plane board 922 is shown in phantom for purposes of illustrating yet other additions which are flexible connectors 945, 946, 947 and 948 which are used to form the interconnections between the second side-plane board 922 and the daughter boards 931, 932, 933, 934. In one implementation, the motherboard 920 and the additional side board 922 are different boards which have different functions. In yet another embodiment, the motherboard or system side board 920 is identical to the system side board 922. In other words, communications or signals that could be transferred from the daughter boards 931, 932, 933, 934 to the first system side board 920 could be also transferred to system side board 922 and not affect the function of the total overall computer system. In other words, system side board 920 would be identical to system side board 922 so that in the event of a failure of either of these boards, the other of the boards may be replaced. During replacement, the signals or inputs and outputs from the daughter boards 931, 932, 933, 934 can be carried by the good board in electrical communication via the flexible connectors while the failed board is replaced. When fully operational, of course, the signals from the daughter boards can be optimized and carried over both boards 920, 922 or both system side-plane boards. One of the chief advantages, of course, is that there is no mechanical stress in replacing the various boards. Yet another advantage is that one of the boards 920 can be replaced while the other board 922 carries the signals from the boards 931, 932, 933, 934. Still another advantage is that systems may be repaired or the side boards 920, 922 can be replaced while the system remains operational. In other words, one of the boards 920, 922 can be replaced while the system remains up and running. There may be performance degradation over that time, however, the system will remain up in a system design to accommodate a hot swapping of one of the boards 920, 922. Still another advantage is that the airflow 960 through the arrangement is a straight-through airflow and the system side boards 920, 922, as well as the daughter boards 931, 932, 933, 934, can be removed in the direction 950, as depicted by the arrow carrying that reference numeral. It should also be noted that transport systems can also be used so that the components within the system box or rack mount 910 can be moved in and out in the direction of the arrow. It should also be noted that transport systems can also be formed which allow for transport in the opposite direction of arrow 950. Yet another advantage is that there are no stack-up tolerance problems since the flexible cables associated with the flexible connectors 941, 942, 943, 944, 945, 946, 947 and 948 allow for tolerance differences. It should also be noted that there may be instances where more than one flexible connector may be used to connect a motherboard to a particular side board 920, 922.

Figure 5:
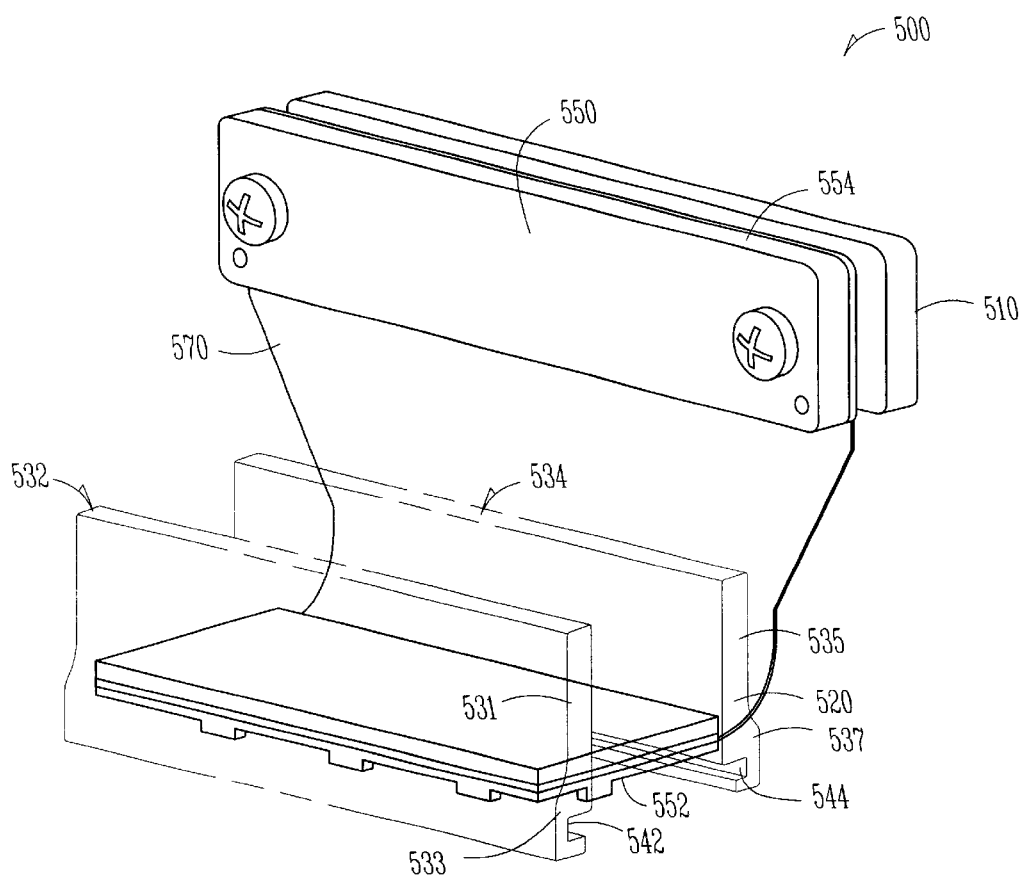
FIG. 5 illustrates a perspective view of the connector system.

FIG. 5 illustrates a perspective view of a representative flexible connector, which is also known as a connector system 500. The connector system includes a fixed end 510, and an actuatable end 520. The fixed end 510 will be further discussed with respect to FIG. 8. Looking further now at FIGS. 5, 6, and 7, the actuatable end 520 will be discussed. The actuatable end 520 includes a frame, or frame portion 530. The frame portion includes two legs 532, 534. The legs 532, 534 are connected to one another by an interconnection portion 536. Thus, the frame or frame portion 530 has a first leg 532 and a second leg 534, which are in fixed relation to one another and interconnected to each other by the interconnection member or portion 536. The first leg 532 includes a first elongated capture member 542. The first leg 532 includes a narrow portion 531 and an end 533, which is essentially C-shaped, and in which the capture feature 542 is within. Essentially the capture feature 542 is an elongated trench which runs substantially along the length of the first leg 532. The second leg 534 includes a narrow portion 535 and a more substantial C-shaped end 537, which includes another capture feature 544. The capture feature 544 is essentially an elongated trench, which is in the end 537 of the leg 534.

Figure 7:
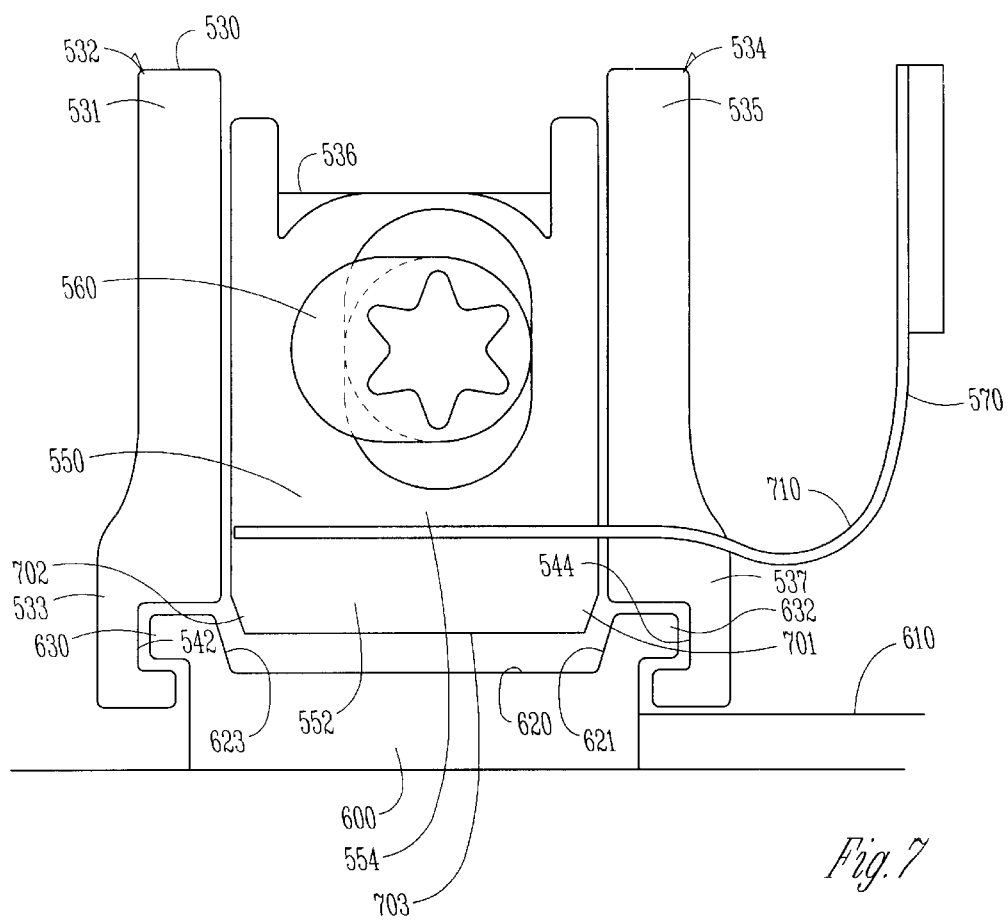
FIG. 7 illustrates an end view of the actuatable portion of the connector system as attached to a receptacle on a printed circuit board.

Connected to the frame 530, and more specifically to the connector 536 between the legs 532, 534, is the actuatable portion 550 of the actuatable end 520 of the connector system 500. The actuatable portion includes one half of an electrical connector 552 and a bracket 554, which is attached to the half of the electrical connector 552. The bracket 554 is connected, or moveably attached, to the connector 536 between the legs 532, 534 by a cam 560. In other words, by moving the cam 560, the bracket 554 and the attached half of the electrical connector 552 move with respect to the connector 536 of the frame 530. It should be noted that the cam 560 shown in FIG. 5 and in FIG. 7 is a rotatable cam, however, other cams could be used including a lever or a wedge which would move the actuatable or the bracket 554 and the half of the connector 552 with respect to the frame 530. Also shown in FIG. 5 is a flex cable 570, which is connected to the fixed end 510 as well as the actuatable end 520. More specifically, the flex cable 570 is attached to the half of the electrical connector 552 shown in FIGS. 5 and 7. It should be noted that the bracket 554 is dimensioned so that it fits very tightly between the legs 532, 534 of the frame 530. In some embodiments, there may even be a set of grooves or a single groove which is used to guide the electrical connector half 552 and the bracket 554 as it is moved with respect to the frame 530.

Figure 6:
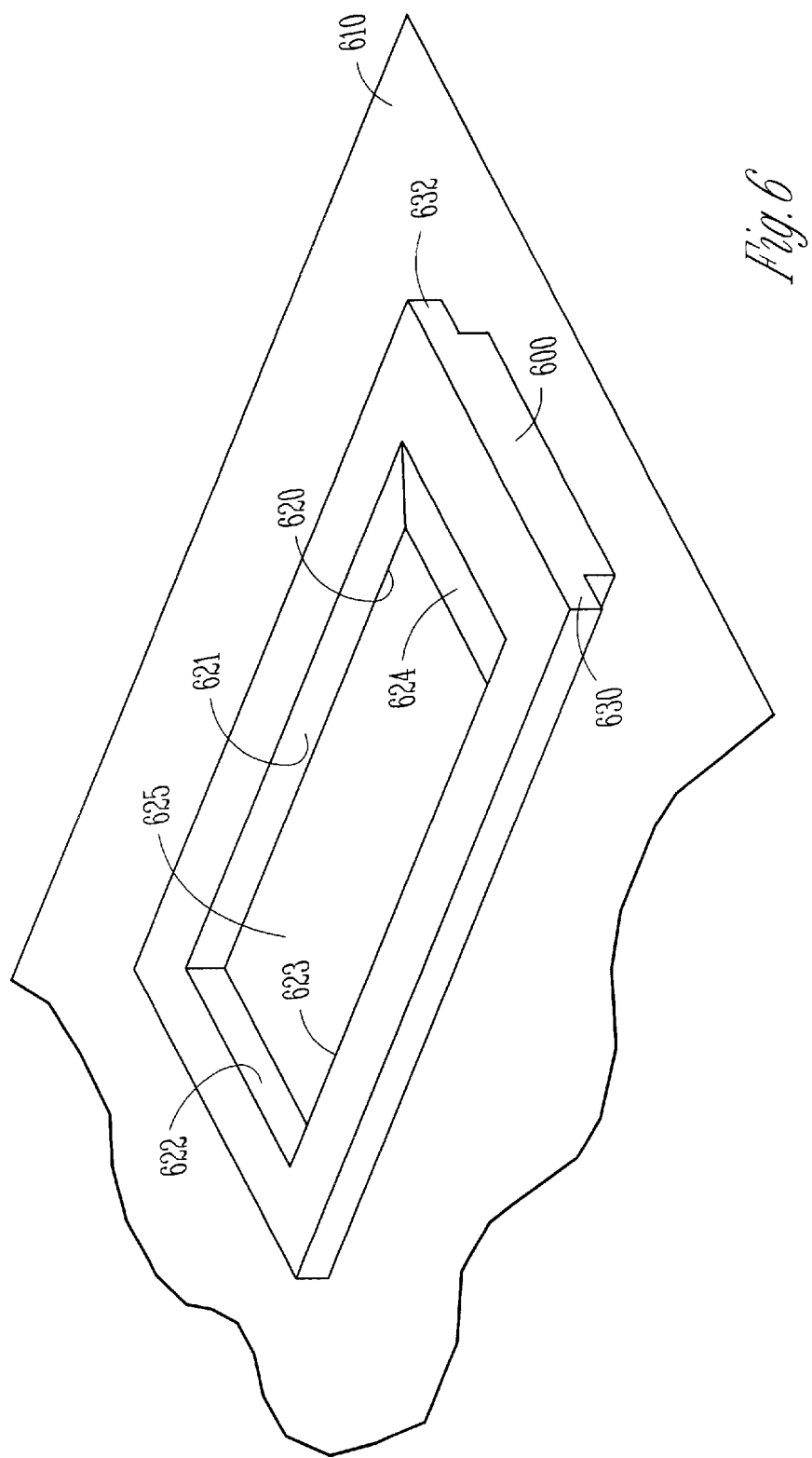
FIG. 6 illustrates a perspective view of the end of the connector system attached to a printed circuit board.

FIG. 6 illustrates a perspective view of a receptacle 600 for receiving the actuatable end 520 of the connector system 500. The receptacle 600 is attached to an electrical device 610 such as a printed circuit board, daughterboard, or motherboard. The other electrical devices 610 need not be a printed circuit board but also could be other things. The receptacle 600 is essentially rectangularly shaped and include an opening 620 therein. The opening 620 has four edges 621, 622, 623, 624. The edges 621, 622, 623, 624 are beveled and serve as guide means for the half of the electrical connector 552, which is attached to the bracket 554 of the actuatable end 520 of the connector system 500. The receptacle 600 also includes a first ear 630 and a second ear 632. The ears, 630, 632, can also be called lips. The ears or lips 630, 632 are elongated rectangular features which engage the capture features 542, 544 of the frame 530 of the actuatable end 520 of the connector system 500. It should be noted that either the lips or ears 630, 632, or the capture members 542, 544, can be provided with beveled surfaces so that as the capture members of the frame 530 slide with respect to the ear 630, 632 the actuatable end 520 goes into a position that is closer to an end position needed to place the actuatable portion 550 into the opening 620. In other words, by beveling or providing a taper on either of the lips or ears 630, 632, or the capture features 542, 544, these will serve as guide means when the frame 530 is placed onto the receptacle 600. It should be noted that the opening 620 also has a bottom or flat portion 625 which can be populated with electrical connectors of any type, such as balls, pins, or receptacles for balls or pins, or any other type of electrical connection. It should be noted that the type of electrical connection is not necessarily limiting to the scope of this invention. Of course, the other half of the electrical connector 552 will have a set of connectors which can mate with the connector found at the surface 625 of the receptacle 600.

FIG. 7 illustrates an end view of the actuatable portion 520 of the connector system 500 as attached to the receptacle 600 on a printed circuit board or other electrical device 610. As shown in FIG. 7, part of the operation has been completed. An operation to connect the actuatable end 520 of the connector system 500 to the receptacle 600, the capture features 542, 544 of the frame 530 are engaged with the ears or lips 630, 632 of the receptacle. The frame 530 is then moved over the ear 630, 632 until the half of the electrical connector 552 is in a position to engage the opening 621 within the receptacle. To help determine when that has been accomplished, several systems can be used including providing a bevel or angled edge on any of the faces of either the capture members 542, 544, or on any of the faces of the ears or lips 630, 632. In some embodiments, a stop will be placed on one end of the receptacle so that the frame 530 stops at the stop. The stop would be placed such that the half of the electrical connector 552 would be substantially in position to engage the opening 620 in the receptacle. In still further embodiments, a detent is provided in one of either the ears or lips 630, 632, or the capture features 542, 544. The detent engages with a corresponding feature to halt the motion of the frame with respect to the receptacle. Once the frame 530 is in the correct position with respect to the opening 620 in the receptacle 600, the cam 560 is engaged to move the bracket 554 with respect to the frame 530. More specifically, the cam 560 moves the bracket 554 with respect to the connector 536 between the legs 532, 534. The half of the electrical connector 552 also includes beveled edges 701, 702, 703. The beveled edges 701, 702, 703 are at the same or substantially the same angle as the beveled edges 621, 622, 623, 624 of the opening 620 in the receptacle 600. Therefore, as the cam moves the bracket 554 and the half of the electrical connector 552, the beveled edges serve as a further guide means to assure that the electrical connectors on the surface of the electrical connector 552 and the surface 625 of the receptacle align. The cam is also designed so that when fully engaged, it produces an appropriate amount of force to allow for sufficient wiping contact and as sufficient force remains so that good electrical contact will be maintained between the receptacle 600 and the actuatable end 520 of the connector system.

It should be noted that in FIGS. 5 and 7, the flex cable has an essentially short length. It should be noted that any length of flex cable can be used and that a loop 710 must be achieved in order to provide a sufficient amount of tolerance so that the connector can be attached without having to strain the electrical connections between the flex cable and the half of the electrical connector 552. In addition, a loop 710 provides for accommodating differences in positions between various electrical devices while not placing a strain on the electrical traces within the flex cable 570.

Figure 8:
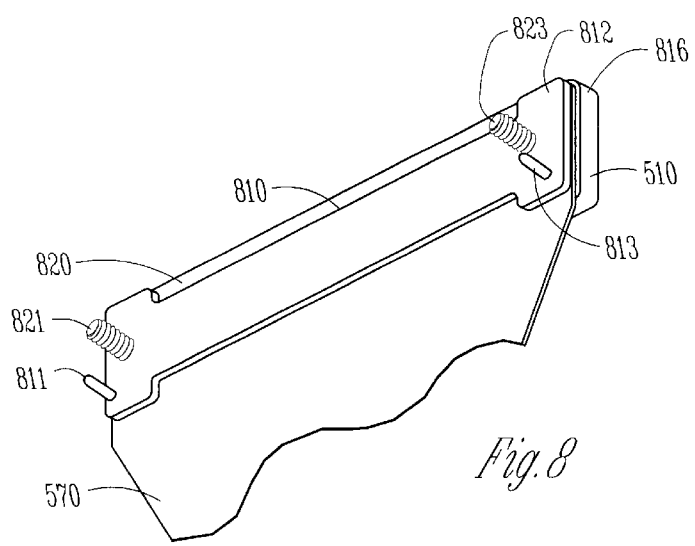
FIG. 8 illustrates a fixed end of the connector system.

FIG. 8 illustrates the fixed end 510 of the connector system. The flex cable 570 is attached to the fixed end 510. The fixed end 510 includes a 240 position C-stack connector 810. The connector 810 has a first frame member having a plurality of electrical contacts 820 extending from the surface of the electrical connector. The first portion 812 of the electrical connector 810 also includes a first guide pin 811 and a second guide pin 813. The guide pins 811, 813 mate with openings in the electrical device or printed circuit board to which the 240 position connector 810 mates. The connector 810 also has a backing portion 816 which stiffens the connector 810. A first screw 821 and a second screw 823 pass through the stiffener 816 and through the first portion 812. The screws 821 and 823 gauge corresponding threaded openings in an electrical device to which the connector 810 connects. It should be noted that the flexible circuit 570 is a two-layer flex circuit which provides for 120 signal carrying wires or traces. In some embodiments, it is necessary for one end of the connector system to be fixed with a fixed end 510. In other embodiments, the connector system 500 may include two actuatable ends.

Many advantages flow from the use of the actuatable connector. Several of the advantages arise from the flexibility the connector affords when configuring motherboards and daughterboards in a computer system. The actuatable connector allows daughterboards to be attached to motherboards while the daughterboard is substantially parallel to the motherboard. This is advantageous since all the printed circuit boards in a system where a number of daughterboards must be connected to a motherboard can be configured to be substantially parallel to one another. This allows for a simple air flow configuration for a rack application. The cooling air would flow past all the boards which are substantially parallel with one another. As a result, there is no need to devote rack space to plenums or "dead space" to allow an air flow path past the printed circuit cards (the motherboard and the daughterboards). This allows for maximum utilization of rack space. In addition, the size of the printed circuit boards can be minimized for each application. Since the printed circuit boards can be parallel to one another, the edges of both the daughterboards and the motherboards can be positioned at the two ends of a "brick" or rack mount system. This allows for connection along both edges which would be comparable to having two side planes. Advantageously, the motherboards and daughterboards can be connected together without deflection on the board. The acuatable connector has a flex cable which can bend. The flex cable allows for a very large mechanical tolerance so that boards could be connected together in a number of configurations without producing physical strains on other boards or the connectors themselves. In other words, the actuatable connector constrains the forces for mating the connector to the connector system, thereby eliminating deflection problems due to other boards or other elements. In addition, since the boards can be placed in parallel with one another, a simple translation mechanism in and out of a volume can be fashioned. In the past, more elaborate translation systems had to be fashioned since one card would have to plug into another card positioned as a backplane.

CONCLUSION

In conclusion, a system assembly for a computer includes a motherboard situated on a printed circuit board, and a daughterboard situated on a printed circuit board. In the system assembly the daughterboard is positioned parallel to the motherboard. The daughterboard is connected to the motherboard using a connector system. The connector system includes a first end attached to one of the motherboard and the daughterboard. The first end has a first portion affixed to either the motherboard or the daughterboard. The first end includes a first capture feature and has an opening therein. The opening has a first set of guideways. A second portion has a second capture feature which mates with the first capture feature. A third portion is attached to the second portion of the connector system. A cam for moves the third portion with respect to the second portion. The third portion has a portion which engages the opening in the first portion of the connector. The connector system has a second end attached to the other of the motherboard or the daughterboard. A flexible circuit electrically connects the first end and the second end of the connector system. In some embodiments the cam includes a wedge. In other embodiments, the cam is rotatable. In some embodiments the second end is fixedly mounted to either the motherboard or the daughterboard. The third portion of the connector system also includes a set of guide ways which mate with the set of guideways of the opening in the first portion of the connector. A first set of electrical contacts is positioned within the opening in one of the first portion or the third portion, and a second set of electrical contacts is positioned on the other of the first portion and the third portion. The first set of electrical contacts electrically connects with the second set of electrical contacts as the first portion of the connector engages the third portion of the connector. The flexible circuit for electrically connecting between the first end and the second end of the connector system is of a length to accommodate different lengths between the motherboard and the daughterboard. The first capture feature of the first portion of the connector system translates with respect to the second capture feature of the second portion until the first portion and the third portion of the connector is substantially aligned. In some embodiments, at least one of the first capture feature and second capture feature are beveled. In some embodiments, the first capture feature and the second capture feature include a detent and detent engaging portion. The detent engaging portion engages the detent when the first portion is substantially aligned with the third portion. In some embodiments, one of the capture features includes a lip and the other of the capture features includes a dovetail which engages the lip.

Also disclosed is a connector system for placing a first electrical component in electrical communication with a second electrical component. The connector system includes a first end attached to the first electrical component. The first end has a first portion affixed to one of the first electrical component and the second electrical component. The affixed portion includes a first capture feature. A second portion has a second capture feature which mates with the first capture feature. A third portion is attached to the second portion. One of the first portion and the second portion has an opening therein. The opening has a set of guide ways. The second and third portion are attached by a cam. The cam allows the third portion to move with respect to the second portion. The third portion includes a portion which engages the opening having a set of guide ways. A second end is attached to the second electrical component. A flexible circuit electrically connects the first end and the second end of the connector system. The set of guide ways includes at least two beveled edges of the opening. In some embodiments, the connector system also includes a first set of electrical contacts positioned within the opening, and a second set of electrical contacts positioned on the portion of the connector which engages the opening. Electrical contact is achieved between the contacts when the third portion of the connector engages the first portion of the connector. In some embodiments, the cam is a wedge, or includes a lobe and is rotatable. The flexible circuit is of a length to form a curve when the first end and the second end are connected between the first electrical component and the second electrical component. The first capture feature of the first affixed portion slides with respect to the second capture feature of the second portion. In some embodiments, at least one of the first capture feature and second capture feature is beveled. In other embodiments, the first capture feature and second capture feature include a detent and detent engaging portion. The detent engaging portion engages the detent when the first portion is substantially correctly positioned in a first plane with respect to the third portion. In some embodiments, one of the first capture feature and the second capture feature of the second portion includes a lip and the other capture feature includes a dovetail which engages the lip.

Also disclosed is a module for a rack mount system including a frame, an air handling device for moving air along a substantially straight air flow path through the frame from a first end of the frame to a second end of the frame, and a plurality of printed circuit boards. The printed circuit boards are removably mounted within the frame. The printed circuit boards have a first edge near the first end of the frame and a second edge near the second end of the frame. The first edge and the second edge of the circuit boards are within the substantially straight air flow path. The plurality of printed circuit boards are substantially parallel to one another. In the rack mount system at least one of the plurality of printed circuit boards includes a system bus thereon. In some embodiments, at least two of the plurality of printed circuit boards include a first electrical contact near one end of the printed circuit board and a second electrical contact near the other end of the printed circuit board. One electrical connector connects between the two electrical contacts near one end of each of the two boards. Another electrical connector connects between two electrical contacts near the other end of each of the two printed circuit boards. In some embodiments, there are at least two electrical connections between at least two of the printed circuit boards.

It is to be understood that the above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A system assembly for a computer comprising:
  a motherboard, and
  a daughterboard, the daughterboard positioned parallel to the motherboard; and
  a connector system for placing the daughterboard in electrical communication with the motherboard, the connector including:
    a first end attached to one of the motherboard and the daughterboard, the first end further comprising:
      a first portion affixed to one of the motherboard and the daughterboard, the affixed portion including a first capture feature, the first portion having an opening therein, the opening having a first set of guideways;
      a second portion having a second capture feature which mates with the first capture feature;
      a third portion; and
      a cam for moving the third portion with respect to the second portion, the third portion including a portion which engages the opening in the first portion of the connector;
    a second end attached to the other of the motherboard and the daughterboard; and
    a flexible circuit electrically connected between the first end and the second end of the connector system.

2. The system assembly for a computer of claim 1 wherein the cam includes a wedge.

3. The system assembly for a computer of claim 1 wherein one of the first end and the second end is fixedly mounted to one of the motherboard and the daughterboard.

4. The connector system of claim 1 wherein the third portion of the connector includes a set of guide ways which mate with the set of guideways of the opening in the first portion of the connector.

5. The system assembly for a computer of claim 1 further comprising:
  a first set of electrical contacts positioned within the opening in one of the first portion and the third portion; and
  a second set of electrical contacts positioned on the other of the first portion and the third portion, the first set of electrical contacts electrically connecting with the second set of electrical contacts as the first portion of the connector engages the third portion of the connector.

6. The system assembly for a computer of claim 1 wherein the cam is rotatable.

7. The system assembly for a computer of claim 1 wherein the flexible circuit electrically connected between the first end and the second end of the connector system is of a length to accommodate different lengths between the motherboard and the daughterboard.

8. The system assembly for a computer of claim 1 wherein the first capture feature of the first portion translates with respect to the second capture feature of the second port ion until the first portion and the third portion of the connector is substantially aligned.

9. The system assembly for a computer of claim 8 wherein at least one of the first capture feature and second capture feature are beveled.

10. The system assembly for a computer of claim 8 wherein the first capture feature and second capture feature include a detent and detent engaging portion, the detent engaging portion engaging the detent when the first portion is substantially aligned with the third portion.

11. The connector system of claim 1 wherein one of the first capture feature and the second capture feature includes a lip.

12. The connector system of claim 11 wherein other of the first capture feature and the second capture feature includes a dovetail which engages the lip.

13. A connector system for placing a first electrical component in electrical communication with a second electrical component, the connector system including:
  a first end attached to one of the first electrical component and the second electrical component, the first end further comprising:

a first portion affixed to one of the first electrical component and the second electrical component, the affixed portion including a first capture feature;

a second portion having a second capture feature which mates with the first capture feature;

a third portion, one of the first portion and the second portion having an opening therein, the opening having a set of guide ways; and a cam for moving the third portion with respect to the second portion, the other of the first portion and the third portion including a portion which engages the opening having a set of guide ways;

a second end attached to the other of the first electrical component and the second electrical component; and a flexible circuit electrically connected between the first end and the second end of the connector system.

14. The connector system of claim 13 wherein the set of guide ways includes at least two beveled edges of the opening.

15. The connector system of claim 13 further comprising:

a first set of electrical contacts positioned within the opening in one of the first portion and the third portion; and a second set of electrical contacts positioned on the other of the first portion and the third portion, the first set of electrical contacts electrically connecting with the second set of electrical contacts as the first portion of the connector engages the third portion of the connector.

16. The connector system of claim 15 wherein the cam is a wedge.

17. The connector system of claim 15 wherein the cam includes a lobe.

18. The connector system of claim 15 wherein the cam is rotatable.

19. The connector system of claim 15 wherein the flexible circuit electrically connected between the first end and the second end of the connector system is of a length to form a curve when the first end and the second end are connected between the first electrical component and the second electrical component.

20. The connector system of claim 15 wherein the flexible circuit electrically connected between the first end and the second end of the connector system is of a length to accommodate different lengths between the first electrical component and the second electrical component.

21. The connector system of claim 15 wherein the first capture feature of the first affixed portion slides with respect to the second capture feature of the second portion.

22. The connector system of claim 21 wherein the first capture feature and second capture feature are beveled.

23. The connector system of claim 21 wherein the first capture feature and second capture feature include a detent and detent engaging portion, the detent engaging portion engaging the detent when the first portion is substantially correctly positioned in a first plane with respect to the third portion.

24. The connector system of claim 15 wherein the first capture feature of the first affixed portion translates with respect to the second capture feature of the second portion.

25. The connector system of claim 15 wherein one of the first capture feature of the first affixed portion and the second capture feature of the second portion includes a lip.

26. The connector system of claim 25 wherein other of the first capture feature of the first affixed portion and the second capture feature of the second portion includes a dovetail which engages the lip.

* * * * *

UNITED STATES PATENT AND TRADEMARK OFFICE
CERTIFICATE OF CORRECTION

PATENT NO. : 6,672,878 B2
DATED : January 6, 2004
INVENTOR(S) : Dean

It is certified that error appears in the above-identified patent and that said Letters Patent is hereby corrected as shown below:

Column 15,
Line 62, delete "," and insert -- ; --, therefor.

Signed and Sealed this

Twenty-second Day of June, 2004

JON W. DUDAS
*Acting Director of the United States Patent and Trademark Office*